(12) United States Patent
Marvin et al.

(10) Patent No.: US 9,804,612 B2
(45) Date of Patent: Oct. 31, 2017

(54) REGULATED BOOTSTRAP POWER SUPPLY

(75) Inventors: Daryl J. Marvin, Farmington, CT (US); Steven M. Millett, Plainville, CT (US)

(73) Assignee: OTIS ELEVATOR COMPANY, Farmington, CT (US)

(*) Notice: Subject to any disclaimer, the term of this patent is extended or adjusted under 35 U.S.C. 154(b) by 644 days.

(21) Appl. No.: 13/808,920

(22) PCT Filed: Jul. 30, 2010

(86) PCT No.: PCT/US2010/043918
§ 371 (c)(1),
(2), (4) Date: Jan. 8, 2013

(87) PCT Pub. No.: WO2012/015427
PCT Pub. Date: Feb. 2, 2012

(65) Prior Publication Data
US 2013/0119965 A1    May 16, 2013

(51) Int. Cl.
H02M 3/156 (2006.01)
G05F 1/46 (2006.01)
H02M 7/538 (2007.01)
H03K 17/567 (2006.01)
H03K 17/687 (2006.01)

(52) U.S. Cl.
CPC ............. *G05F 1/46* (2013.01); *H02M 7/538* (2013.01); *H03K 17/567* (2013.01); *H03K 17/6871* (2013.01); *H03K 2217/0081* (2013.01)

(58) Field of Classification Search
CPC .. G05F 3/24; G05F 1/56; G05F 1/575; H02M 3/1584; H02M 3/1588; H02M 3/156

USPC ................ 323/265, 272, 273, 282, 351
See application file for complete search history.

(56) References Cited

U.S. PATENT DOCUMENTS

| | | | |
|---|---|---|---|
| 4,117,382 | A | 9/1978 | Yonemoto |
| 4,554,873 | A | 11/1985 | Rex |
| 5,058,710 | A | 10/1991 | Iwasa |
| 5,264,736 | A | 11/1993 | Jacobson |
| 5,365,118 | A | 11/1994 | Wilcox |
| 6,163,472 | A | 12/2000 | Colby |
| 6,441,652 | B1 | 8/2002 | Qian |

(Continued)

FOREIGN PATENT DOCUMENTS

| | | |
|---|---|---|
| CN | 101247080 | 8/2008 |
| CN | 201191807 Y | 2/2009 |
| JP | 2010-057333 A | 3/2010 |

OTHER PUBLICATIONS

IR 2110 Data Sheet (International Rectifier Comp), "High and Low Side Driver," Mar. 23, 2005 (18 pages).

(Continued)

*Primary Examiner* — Adolph Berhane
(74) *Attorney, Agent, or Firm* — Carlson, Gaskey & Olds

(57) ABSTRACT

An exemplary power supply includes a low side switch and a high side switch. A driver controls operation of the high side switch. A bootstrap capacitor supplies power to the driver. An energy storage portion is in parallel with the bootstrap capacitor to provide control over whether a voltage of the bootstrap capacitor drops below a desired voltage. A voltage regulator is in parallel with the bootstrap capacitor for limiting current provided to the bootstrap capacitor and for regulating a voltage of the bootstrap capacitor.

17 Claims, 2 Drawing Sheets

(56) References Cited

U.S. PATENT DOCUMENTS

| | | | |
|---|---|---|---|
| 6,483,271 | B1 | 11/2002 | Thebeau et al. |
| 6,650,100 | B1 | 11/2003 | Kohout et al. |
| 6,747,441 | B2 | 6/2004 | Johnson et al. |
| 6,873,191 | B2 | 3/2005 | Dequina et al. |
| 6,897,643 | B2 | 5/2005 | Stone |
| 7,026,801 | B2 | 4/2006 | Fowler et al. |
| 7,468,622 | B2 | 12/2008 | Bodano et al. |
| 7,518,352 | B2 | 4/2009 | De Lima Filho et al. |
| 7,560,912 | B2 * | 7/2009 | Xu et al. ............ 323/266 |
| 7,907,430 | B2 * | 3/2011 | Kularatna et al. ......... 363/59 |
| 8,138,731 | B2 * | 3/2012 | Chen ............ 323/272 |
| 8,405,370 | B2 * | 3/2013 | Chen ............ 323/272 |
| 2007/0114981 | A1 * | 5/2007 | Vasquez et al. ......... 323/266 |
| 2013/0170263 | A1 * | 7/2013 | Newman et al. ......... 363/126 |

OTHER PUBLICATIONS

International Search Report and Written Opinion of the International Searching Authority for International application No. PCT/US2010/043918 dated Apr. 4, 2011.

Chinese Search Report for Chinese Application No. 201080068333.8 dated Jul. 23, 2014.

Supplementary Chinese Search Report for Chinese Application No. 201080068333.8, dated Aug. 23, 2015.

\* cited by examiner

REGULATED BOOTSTRAP POWER SUPPLY

BACKGROUND

Bootstrap power supplies are known. Most bootstrap power supply circuits are used in consumer electronic devices. Typical gate driver integrated circuits are designed to function with a bootstrap supply, for example.

FIG. 1 illustrates a typical bootstrap power supply arrangement 10 for providing power to a load 12. A voltage source 14 has an associated current limiting resistor 16 and a rectifier 18. A low side IGBT 20 switches on and off in a known manner. A high side IGBT 22 is controlled by an upper gate driver 24. A bootstrap capacitor 26 powers the upper gate driver 24.

The voltage source 14 charges the bootstrap capacitor 26 when the low side IGBT 20 is conducting. When the low side IGBT 20 is turned off, the bootstrap capacitor 26 is left floating. In that condition, the bootstrap capacitor 26 is connected with the upper gate driver 24 and the emitter of the high side IGBT 22. When the low side IGBT 20 is off, the voltage drop across it effectively changes the voltage that is used for charging the bootstrap capacitor 26. Under those conditions, the power supply for the upper gate driver 24 is unregulated. This is undesirable in many circumstances. For example, the unregulated power supply renders it of limited use for high voltage applications.

In a high voltage arrangement, the voltage drops across the low side IGBT 20 can be significant compared to the voltage source 14. This produces a large variation in the charging voltage of the bootstrap capacitor 26 and makes it very difficult to remain within the desired voltage range for the upper gate driver 24. The large voltage variation also has a negative effect on the switching performance of the IGBTs 20 and 22.

Another limitation on the typical arrangement shown in FIG. 1 is that the rate at which the bootstrap capacitor 26 can be charged is relatively slow. This requires a larger resister 16 in series with the diode 18. The current limiting resistor 16 protects the upper gate driver 24 from a high change rate of voltage at initial turn on and limits the rate at which the bootstrap capacitor 26 can be charged. For some high voltage situations, the amount of time available for charging the bootstrap capacitor 26 is very limited and without a sufficiently high rate of charging, the arrangement shown in FIG. 1 is not useful.

SUMMARY

An exemplary power supply includes a low side switch and a high side switch. A driver controls operation of the high side switch. A bootstrap capacitor supplies power to the driver. An energy storage portion is in parallel with the bootstrap capacitor to control any dropping of a voltage of the bootstrap capacitor. A voltage regulator is in parallel with the bootstrap capacitor for limiting current provided to the bootstrap capacitor and for regulating a voltage of the bootstrap capacitor.

An exemplary method of controlling power supply from a bootstrap capacitor to a driver that controls a switch includes providing an energy storage in parallel with the bootstrap capacitor. The energy storage provides control over whether a voltage of the bootstrap capacitor drops below a desired voltage used to power the driver. The voltage of the bootstrap capacitor is regulated using a linear regulator in parallel with the bootstrap capacitor.

The various features and advantages of disclosed example embodiments will become apparent to those skilled in the art from the following detailed description. The drawings that accompany the detailed description can be briefly described as follows.

DETAILED DESCRIPTION

Figure 1:
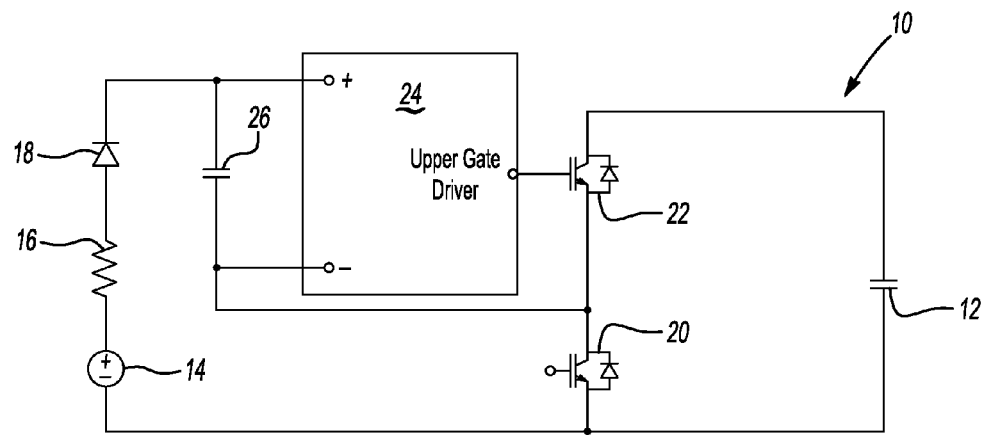
FIG. 1 schematically illustrates a bootstrap capacitor power supply arrangement from the prior art.
Figure 2:
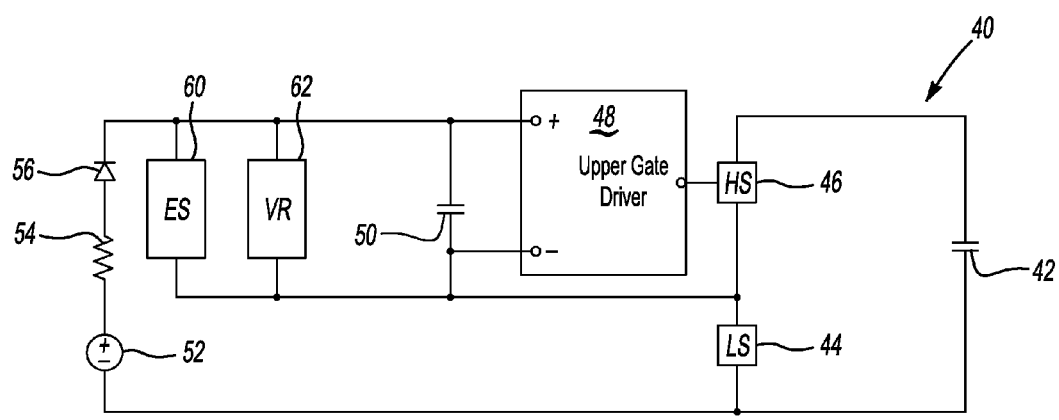
FIG. 2 schematically illustrates a power supply arrangement designed according to an embodiment of this invention.

FIG. 2 schematically shows a power supply 40 for providing power to a load 42. In one example, the load 42 comprises a DC bus. In one example, the DC bus comprises a high voltage DC bus. One example includes voltages exceeding 120 volts on the DC bus. In an example used for an elevator system, the voltages may be on the order of 750 volts and up to 1200 volts.

A low side switch 44 and a high side switch 46 control power provided to the load 42. The high side switch 46 is controlled by an upper gate driver 48. A bootstrap capacitor 50 provides power to the upper gate driver 48.

A voltage source 52 is in series with a current limiting resistor 54 and a rectifier 56. In one example, the voltage source 52 comprises a high voltage source.

The illustrated example includes an energy storage portion 60 in parallel with the bootstrap capacitor 50 and a voltage regulator 62, which is also in parallel with the bootstrap capacitor 50. The energy storage portion 60 adds voltage in parallel with the bootstrap capacitor 50 to prevent the voltage of the bootstrap capacitor 50 from dropping until a voltage of the energy storage portion 60 drops below the voltage of the bootstrap capacitor 50. In other words, the energy storage portion 60 provides some control over whether the voltage of the bootstrap capacitor 50 will drop. This feature of the energy storage 60 allows for using relatively less expensive capacitors as the bootstrap capacitor 50, for example.

The energy storage portion 60 also allows for the voltage source 52 to be higher than the maximum voltage that can be provided to the upper gate driver 48. The presence of the energy storage portion 60 also promotes a faster, more effective charging of the bootstrap capacitor 50.

The voltage regulator 62 regulates the voltage of the bootstrap capacitor 50. In one example, a linear regulator is used. The voltage regulator 62 also limits the in rush current to the bootstrap capacitor 50, which facilitates using relatively less expensive capacitors.

The illustrated example allows for a bootstrap power supply to be used in a high voltage scenario because the energy storage portion 60 and the voltage regulator 62 dampen the effects of the voltage drop associated with the low side switch 44 turning off. The energy storage portion 60 and the voltage regulator 62 also protect the bootstrap capacitor 50 and the upper gate driver 48 from experiencing a rapid increase in voltage. The energy storage portion 60 and voltage regulator 62 also facilitate charging the bootstrap capacitor 50 more rapidly than was possible with traditional bootstrap power arrangements.

Figure 3:
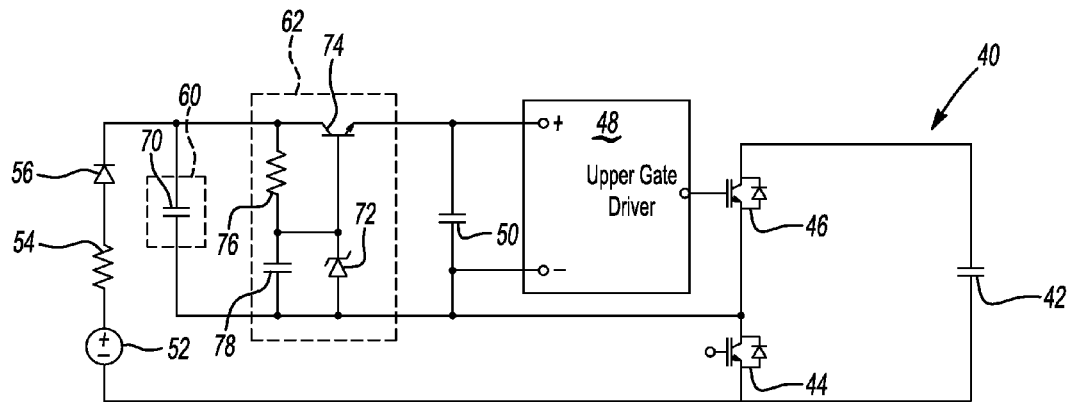
FIG. 3 schematically illustrates another example power supply arrangement designed according to this invention.

FIG. 3 schematically illustrates another example power supply 40 in which the energy storage portion 60 comprises a capacitor 70. The capacitance of the bootstrap capacitor 50 and the energy storage capacitor 70 are selected so that the voltage on the bootstrap capacitor 50 will not drop until the voltage on the capacitor 70 drops below that of the bootstrap capacitor 50.

The voltage regulator 62 in the example of FIG. 3 comprises a linear regulator including a zener diode 72. The breakdown voltage of the zener diode 72 is selected to be higher than the desired voltage of the bootstrap capacitor 50 so that the regulator 62 is operative to charge the bootstrap capacitor 50. In one example, the breakdown voltage of the zener diode 72 is approximately 0.7 volts higher than the desired voltage of the bootstrap capacitor 50 for powering the upper gate driver 48. The linear regulator in this example includes a transistor 74 having its base in series with the zener diode 72. A regulator resistor 76 and regulator capacitor 78 are also included in this example.

In the example of FIG. 3, the switches 44 and 46 comprise IGBTs. Other switch configurations such as an FET or another semiconductor switch may be used in some examples.

Figure 4:
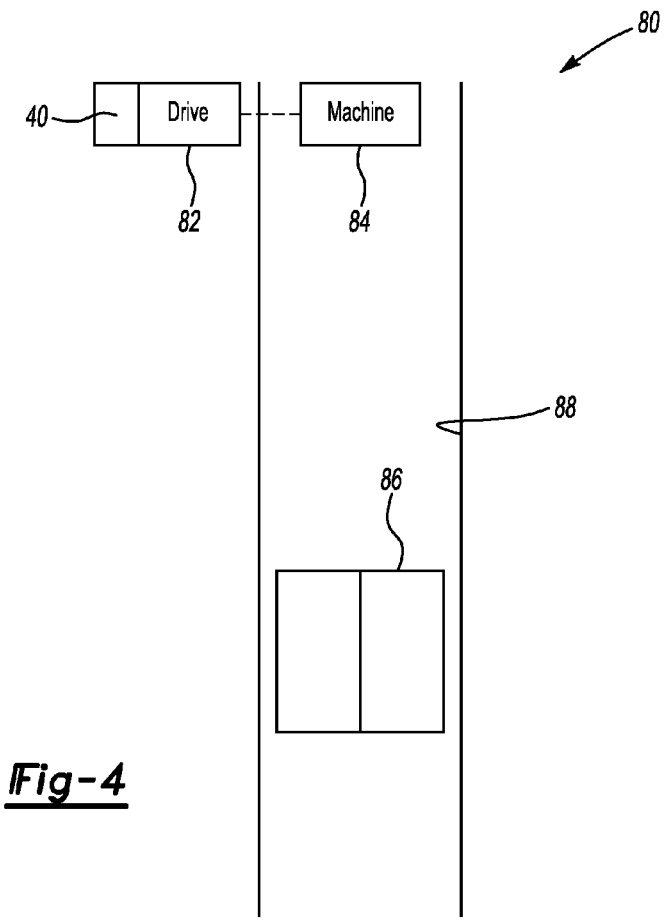
FIG. 4 schematically illustrates selected portions of an elevator system that includes a power supply designed according to an embodiment of this invention.

The example power supplies 40 of FIGS. 2 and 3 may be used in a variety of situations. FIG. 4 illustrates one example use of such a power supply within an elevator system 80. The power supply 40 is used for powering the drive 82 associated with an elevator machine 84. Movement of an elevator car 86 within a hoistway 88 is controlled by operation of the machine 84. The elevator system components require high voltage and the power supply including the energy storage portion 60 and the voltage regulator 62 allows for using a bootstrap power supply configuration in the high voltage elevator system environment.

One feature of the illustrated example power supplies is that for an elevator drive, there no longer is a requirement for expensive isolating transformers and separate switch mode power supplies for the gate driving circuitry. In elevator drives, each of the power switches (e.g., the IGBTs 44 and 46 in FIG. 3) need an isolated power source that can drive their gates to control the switches. The typical approach of using isolating transformers and separate switch mode power supplies for the gate driving circuitry tends to add significant cost to an elevator system's drive power supply. With the illustrated example arrangement, cost savings are possible and a robust solution for powering the upper gate driver 48 is realized.

The illustrated examples provide a cost and space optimal solution for an upper IGBT gate driver power supply. The example power supplies minimize constraints otherwise imposed on a pulse width modulation by allowing for faster charging and a larger minimum on time for the low side switch.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A power supply, comprising:
 a low side switch;
 a high side switch;
 a driver that controls operation of the high side switch;
 a bootstrap capacitor that supplies power to the driver;
 an energy storage portion in parallel with the bootstrap capacitor; and
 a voltage regulator in parallel with the bootstrap capacitor for limiting current provided to the bootstrap capacitor and for regulating a voltage of the bootstrap capacitor.

2. The power supply of claim 1, wherein the energy storage portion comprises a second capacitor.

3. The power supply of claim 2, wherein the second capacitor prevents a voltage of the bootstrap capacitor from dropping below a desired voltage until after the second capacitor voltage drops below the voltage of the bootstrap capacitor.

4. The power supply of claim 1, wherein the voltage regulator comprises a linear voltage regulator.

5. The power supply of claim 4, wherein the voltage regulator comprises a zener diode having a breakdown voltage selected so that the voltage source charges the bootstrap capacitor.

6. The power supply of claim 5, wherein the zener diode breakdown voltage is higher than a desired voltage of the bootstrap capacitor.

7. The power supply of claim 6, wherein the zener diode breakdown voltage is approximately 0.7 volts higher than the desired voltage of the bootstrap capacitor.

8. The power supply of claim 5, wherein the voltage regulator comprises a transistor having a base in series with the zener diode and wherein the transistor and the zener diode are in parallel with the bootstrap capacitor.

9. The power supply of claim 1, comprising a DC bus coupled with the low side switch and the high side switch such that the switches control power supply to the DC bus.

10. The power supply of claim 9, wherein the DC bus comprises a high voltage DC bus.

11. The power supply of claim 1, comprising
 an elevator system drive that controls operation of an elevator machine to cause selected movement of an elevator car; and
 wherein the driver controls the high side switch to control power supply to the elevator system drive.

12. A method of controlling power supply from a bootstrap capacitor to a driver that controls a high side switch, comprising the steps of:
 providing an energy storage in parallel with the bootstrap capacitor, the energy storage providing control over whether a voltage of the bootstrap capacitor drops below a desired voltage used to power the driver; and
 regulating the voltage of the bootstrap capacitor using a linear regulator in parallel with the bootstrap capacitor.

13. The method of claim 12, comprising using the linear regulator for limiting an amount of current supplied to the bootstrap capacitor.

14. The method of claim 12, wherein the energy storage comprises a capacitor and the method comprises preventing the voltage of the bootstrap capacitor from dropping below the desired voltage until the energy storage capacitor voltage drops below the voltage of the bootstrap capacitor.

15. The method of claim 12, comprising using the high side switch for controlling power delivered to a DC bus.

16. The method of claim 15, wherein the DC bus comprises a high voltage DC bus.

17. The method of claim 12, comprising
 providing power to an elevator system drive as a result of controlling power supply from the bootstrap capacitor to the driver; and controlling an elevator system machine based on the power provided to the elevator system drive to cause selected movement of an elevator car.

\* \* \* \* \*

UNITED STATES PATENT AND TRADEMARK OFFICE
CERTIFICATE OF CORRECTION

PATENT NO. : 9,804,612 B2
APPLICATION NO. : 13/808920
DATED : October 31, 2017
INVENTOR(S) : Daryl J. Marvin and Steven M. Millett It is certified that error appears in the above-identified patent and that said Letters Patent is hereby corrected as shown below:

In the Claims

In Claim 5, Column 4, Line 18; after "selected so that" replace "the voltage source" with --the voltage regulator--

Signed and Sealed this
Twenty-first Day of August, 2018

Andrei Iancu
*Director of the United States Patent and Trademark Office*